United States Patent [19]

Walton

[11] 4,026,011

[45] May 31, 1977

[54] FLEXIBLE CIRCUIT ASSEMBLY

[75] Inventor: Tommy L. Walton, Carlsbad, Calif.

[73] Assignee: Burroughs Corporation, Detroit, Mich.

[22] Filed: Aug. 28, 1975

[21] Appl. No.: 608,550

[52] U.S. Cl. .................................. 29/625; 29/624; 174/68.5; 339/17 F; 361/398
[51] Int. Cl.² .......................................... B41M 3/08
[58] Field of Search ............ 29/625, 624, 626, 628; 317/101 CM, 101 CP, 101 C, 101 D, 101 F, 101 DH; 339/17 R, 17 F, 176 MF; 174/68.5, 126 R, 128 R

[56] References Cited

UNITED STATES PATENTS

| | | | |
|---|---|---|---|
| 3,221,095 | 11/1965 | Cook | 174/68.5 |
| 3,346,415 | 10/1967 | Hachenberger | 174/68.5 X |
| 3,409,732 | 11/1968 | Dahlgren et al. | 317/101 CM X |
| 3,471,348 | 10/1969 | Shaheen et al. | 174/68.5 X |
| 3,509,270 | 4/1970 | Dube et al. | 174/68.5 |
| 3,579,206 | 5/1971 | Grange | 340/173.1 |
| 3,805,213 | 4/1974 | Austin | 339/17 F |
| 3,818,122 | 6/1974 | Luetzow | 174/86 |
| 3,916,515 | 11/1975 | Walsh et al. | 29/626 |

OTHER PUBLICATIONS

Aridto et al., "Making Multilayer Circuit Board with Cable Connection," IBM Technical Disclosure Bulletin, vol. 14, No. 3, pp. 701, 702, Aug., (1971).

Primary Examiner—James R. Duzan
Attorney, Agent, or Firm—Mervyn L. Young; Kevin R. Peterson

[57] ABSTRACT

A flexible circuit assembly and a method of making it in which there are no separate electrical interconnections between the flexible interconnecting cable and the rigid connector. A flexible insulating film is bonded to a surface of the connector member and extends from the connector to provide a flexible interconnecting cable for external electrical connections. A plurality of conductors on the insulating film provides a continuous electrically conductive path thus providing an interfaceless electrical connection between the rigid connector and the flexible interconnecting cable. In the method, a metallic clad insulating film is placed on a surface of a rigid support member which includes a portion which will serve as the connector. The support member also includes a filler block portion in the space designated for the flexible interconnecting cable. The film is selectively bonded to the connector portion of the support member. Conductors are then formed on the insulating film. The filler block is then removed to leave a rigid connector and a flexible interconnecting cable which has a plurality of continuous conductors thereon thereby eliminating a separate electrical connection therebetween.

6 Claims, 10 Drawing Figures

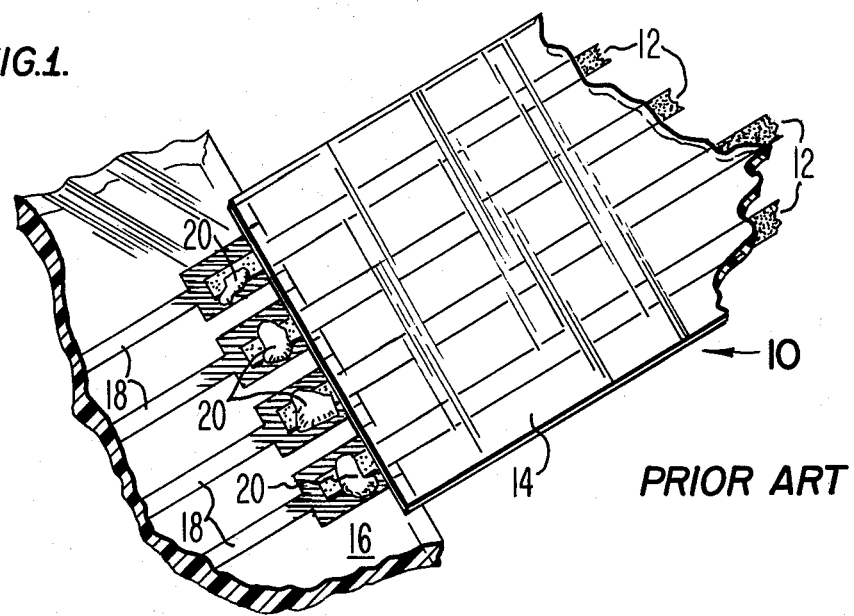
FIG.1.
PRIOR ART
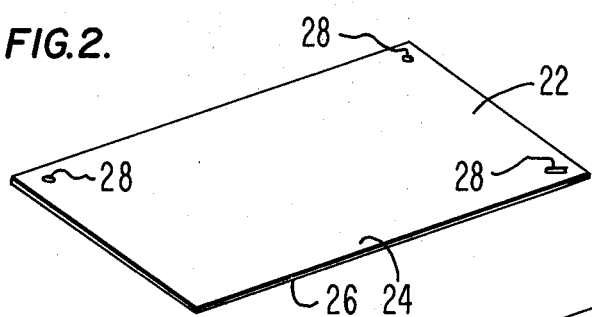
FIG.2.
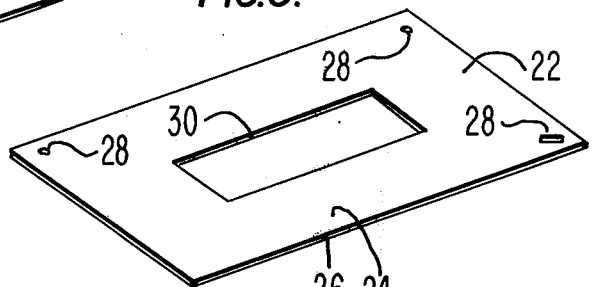
FIG.3.
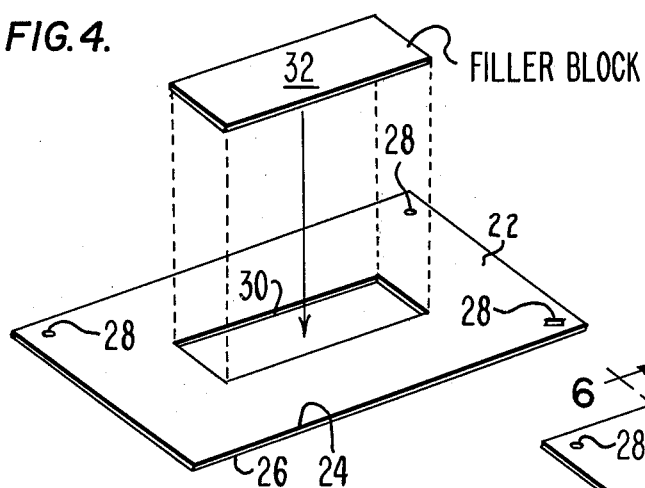
FIG.4. FILLER BLOCK
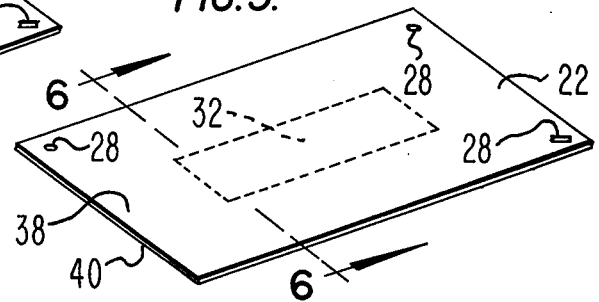
FIG.5.

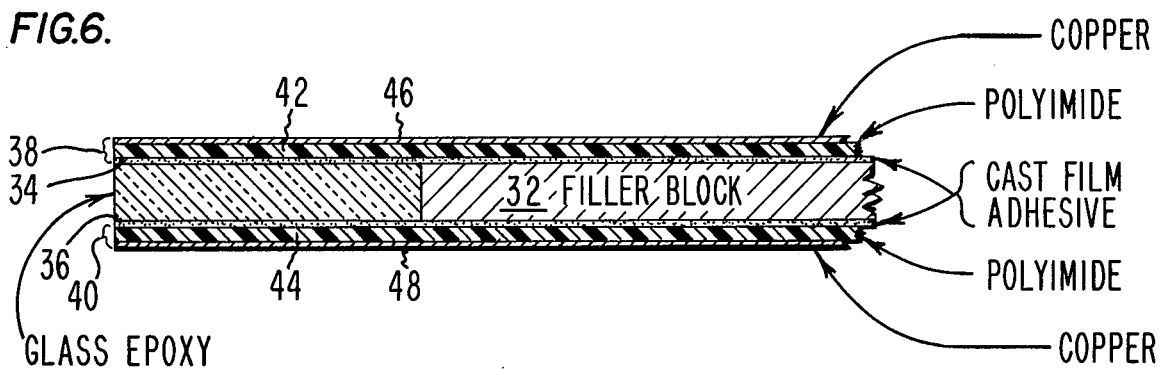
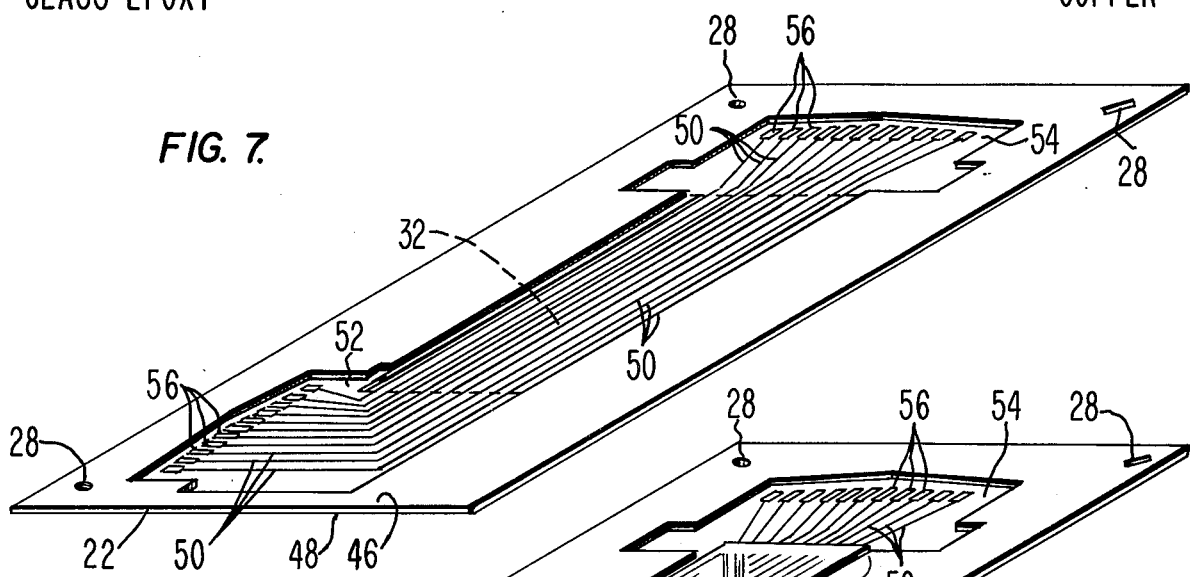
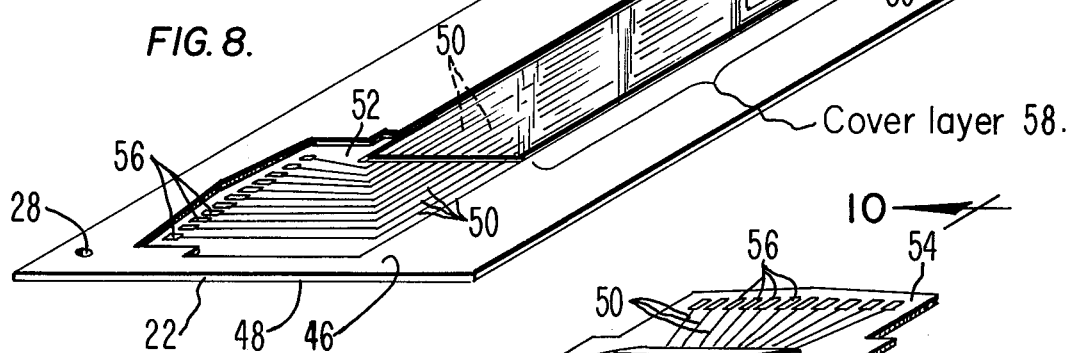
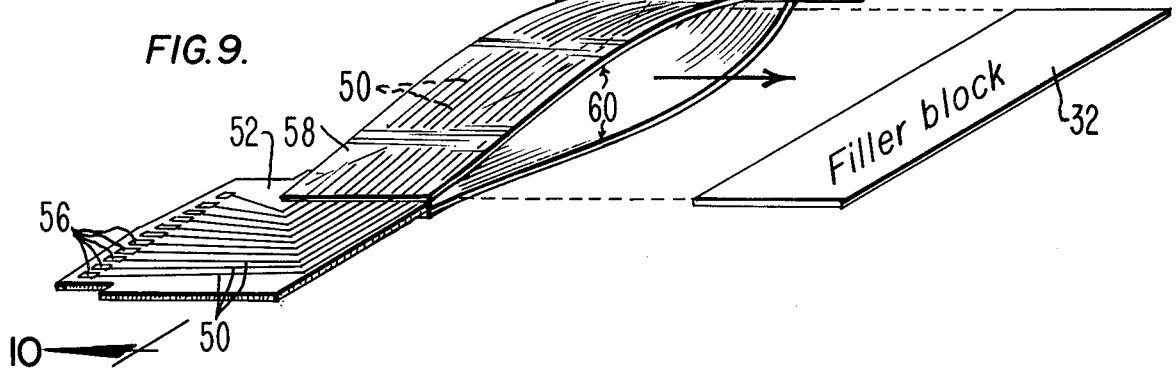

FLEXIBLE CIRCUIT ASSEMBLY

CROSS-REFERENCE TO RELATED APPLICATION

Reference is made herein to U.S. patent application Ser. No. 608,457 entitled "Cover Layer For Flexible Circuits," filed Aug. 28, 1975, having the same inventor and assignee as the present invention.

BACKGROUND OF THE INVENTION

This invention relates to connectors for electrical circuits. More particularly, it involves a flexible circuit assembly and a method of making it.

A typical flexible circuit assembly as embodied in the prior art is shown in FIG. 1. The flexible circuit assembly includes a flexible interconnecting cable 10 which includes a plurality of spaced parallel conductors 12 which are encapsulated by an upper and lower layer of a flexible insulating film 14. In most applications, the flexible interconnecting cable 10 connects two rigid edge connectors (one of which is shown in FIG. 1) which are adapted to engage an external female socket. One type of connector is formed on a printed circuit board 16 and includes a plurality of printed conductors 18 thereon which correspond with the conductors 12 in the flexible interconnecting cable 10. In order to make the electrical connections between the conductors 18 on the connector and the conductors 12 of the flexible cable 10, one had to strip the insulating film 14 to bare the ends of the conductors 12. Then, a separate electrical connection was made between the conductors 12 of the flexible cable 10 and the conductors 18 on the connector. One widely used method is to solder the corresponding conductors together as shown as designated by the numeral 20. This has proved to be an extremely time consuming operation. Furthermore, the reliability of the connection has not been entirely satisfactory, especially when it is realized that the space between adjacent conductors may be as small as 0.005 inches. Other methods have been contemplated to connect the flexible cable with the rigid connectors. However, they have also had similar disadvantages. In any case, the prior art has required that some kind of separate connection be made between the conductors on or in the connectors and the conductors of the flexible cable. In other words, the prior art has considered flexible circuit assemblies as a discrete three component system (two rigid connectors and the flexible interconnecting cable) and consequently, has required some kind of connection between each component.

SUMMARY OF THE INVENTION

It is, therefore, the primary object of this invention to provide a flexible circuit assembly and a method of making it, in which there are no separate interconnections between the flexible cable and the rigid connector.

Briefly, this invention accomplishes this objective by placing a flexible metallic clad insulating film on a surface of a rigid support member. The support member includes at least one portion which will later serve as the rigid connector. The support member also includes a filler block in the space desired to form the flexible interconnecting cable. The insulating film is then selectively bonded to the connector portion of the support member. Conductors are then formed on the insulating film to provide a plurality of continuous conductors on both the rigid connector portion and on the insulating film which is covering the filler block. The filler block is then removed to leave a flexible cable in the space in which the filler block previously occupied. However, the conductors provide a continuous interfaceless electrically conductive path on both the connector portion and the flexible cable since the insulating film has been previously bonded to the rigid connector portion of the support member. Accordingly, the time consuming and unreliable connections between the flexible cable and the rigid connector as required by the prior art is eliminated.

BRIEF DESCRIPTION OF THE DRAWINGS

FIG. 1 shows a perspective view of an example of the prior art which requires a separate electrical connection between the flexible cable and the rigid connector;

FIG. 2 shows a perspective view of a rigid support member during one step of the method of this invention;

FIG. 3 shows a perspective view of the support member during a succeeding step in the method of this invention;

FIG. 4 shows an exploded perspective view of the support member and filler block portion during a succeeding step in the method of this invention;

FIG. 5 shows a perspective view of the assembled support member shown in FIG. 4 after a metallic clad insulating film has been bonded to the surfaces thereof;

FIG. 6 shows a partial sectional view along the line 6—6 of FIG. 5;

FIG. 7 shows a perspective view of the laminated support member shown in FIGS. 5 and 6 after a conductor pattern has been etched therein;

FIG. 8 shows a perspective view of the support member shown in FIG. 7 with the addition of a cover layer bonded to intermediate portions of the conductors;

FIG. 9 shows a perspective view of the flexible circuit assembly made in accordance with this invention after peripheral portions of the support member have been severed and the filler block removed.

DESCRIPTION OF A PREFERRED EMBODIMENT

Figure 10:
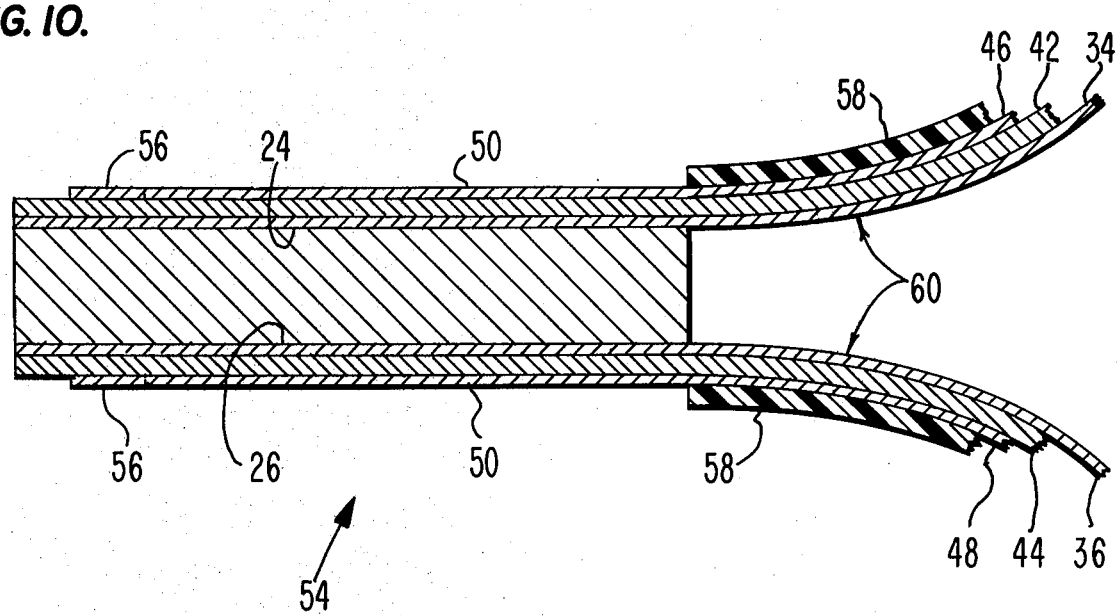
FIG. 10 shows an enlarged longitudinal partial sectional view of a rigid connector and attached flexible cable made in accordance with this invention.

Referring now to FIG. 2, there is shown a generally rectangular rigid support member 22. Support member 22 has two substantially flat parallel major surfaces, designated as upper surface 24 and lower surface 26. In this preferred embodiment, support member 22 is approximately 62 mils thick between major surfaces 24 and 26. Support member 22 serves as an insulating substrate and can be made of typical circuit board materials such as glass fibric base epoxy, paper base phenolic, or random glass fiber polyester. This group of materials include NEMA (National Electronics Manufacturers Association) XXXP; XXXPC; FR-2, 3, 4, and 5; B-10 and 11; and FR-6. As will become evident later in this description, the material for support member 22 is chosen to be that desired for the rigid connectors of the flexible circuit assembly. Tooling holes 28 can be punched into several of the corners of the support member to aid in registration with automated machinery.

Referring now to FIG. 3, an opening or slot 30 is cut into the support member 22. This can be accomplished, for example, by stamping techniques known in the art. The configuration of slot 30 is chosen to coincide with the configuration desired for the flexible interconnecting cable of the flexible circuit assembly. Consequently, the size and shape of slot 30 can be varied according to the length and shape desired for the flexible interconnecting cable.

Referring now to FIG. 4, a filler block 32 is inserted into the slot 30 of support member 22. Filler block 32 has the same peripheral dimensions as slot 30 and the same thickness as support member 22. In such manner, the filler block 32 fills the void left by slot 30. Filler block 32 is preferably made of a rigid material to which adhesives will not readily bond. A preferred material is "Teflon," a trademark of E. I. du Pont de Nemours and Company, Inc.

Referring now to FIG. 5, a metallic clad insulating film 38, 40 is bonded to the upper surface 24 and lower surface 26, respectively, of support member 22. As can be seen most clearly in FIG. 6, this is preferably accomplished by placing an adhesive cast film 34 and 36 on the upper surface 24 and lower surface 26, respectively. A metallic clad insulating film generally designated by the numerals 38 and 40 are placed on top of the adhesive film 34 and 36, respectively. The metallic clad insulating film 38, 40 includes a flexible sheet approximately 3 mils thick of "Kapton," a trademark of E. I. du Pont de Nemours and Company, Inc. for a polyimide film. Other materials which may be used for insulating film 42, 44 include polyvinyl chloride, polyolefins such as polyethylene or polypropylene, polytetrafluoroethylene and the like. On the outer surfaces of insulating film 42, 44 is a layer of metal, preferably copper. In this preferred embodiment, copper layers 46 and 48 are evenly distributed on insulating film 42 and 44 in the amount of approximately 1 ounce per square foot. The metallic clad insulating film 38, 40 may be that distributed by Fortin Laminating Corporation of San Fernando, California under the trade name "Poly-Core EPO31CO3." It should be noted also that adhesive layers 34 and 36 can be of any of the well known thermosetting adhesives which are used in flexible circuit technology. A preferred adhesive is a modified epoxy adhesive. A modified epoxy adhesive is an adhesive fabricated by combining standard epoxy resins with polyimide resins to form a thermo-setting adhesive capable of withstanding high temperatures. As is also known in the art, the copper layers 46 and 48 may have been previously bonded to insulating film 42 and 44 by a similar thin layer of a modified epoxy adhesive (not shown).

After the various layers have been positioned as shown in FIGS. 5 and 6, they are selectively bonded to surfaces 24 and 26 of support member 22. However, they are not bonded to the filler block 32. This is accomplished by laminating the layers together in a hydraulic press which is heated to about 340° ±10° F at a pressure of about 50–500 pounds per square inch, for approximately 45–60 minutes. As a particular example, lamination takes place at 340° F at 250 psi for 60 minutes. The adhesive layers 34 and 36 bond the metallic clad insulating film 38 and 40, respectively, to the support member 22. However, the adhesive layers 34 and 36 will not bond to the Teflon filler block 32. If an epoxy adhesive is used for layers 34 and 36 the epoxy will simply set into a flexible non-sticky layer which will be bonded to the insulating film and support member 22 but not to the Teflon filler block 32. It should be noted that the time, temperature and pressure during lamination can be varied as known in the art depending upon the materials used and the co-dependency between the time, heat, and pressure factors, etc.

For the remaining description of this invention, reference will be made to processing only the upper surface of the laminated support member. However, it should be realized that the same processing takes place on the lower surface as well. Referring now to FIG. 7, the next step in the method of this invention is to etch copper layer 46 to form a plurality of spaced conductors 50. Portions of the support member 22 are also etched in the configuration desired for the rigid connectors for the flexible circuit assembly. Connector portions 52 and 54 abut the end portions of the filler block 32. It is important to note, however, that only the copper is etched away and that the insulating film still remains covering the support member 22 and filler block 32. Copper layer 46 can be etched using known photolithographic techniques known in flexible circuit technology. Briefly, this is accomplished by applying a photoresist to copper layer 46, exposing a desired circuit pattern using opaque masks, and then developing the resist. The developed photoresist is then washed away leaving selected portions of the copper layer exposed in the desired circuit pattern. A thin layer of a tin and lead alloy is then electroplated onto the exposed copper. The remaining photoresist is then stripped away. Then the portions of the copper layer 46 which are not covered by the tin and lead alloy are then etched away using a suitable etchant such as ammonium persulphate. For ease of illustration, the tin and lead alloy is not shown in the drawings.

As shown in FIG. 7, the copper has been etched only in the areas defined by the two connector portions 52 and 54 and the area defined by the filler block 32. The conductors 50 were originally a part of copper layer 46. The conductors 50 are also etched in such manner that they terminate at each end in an enlarged contact pad 56. The contact pads 56 provide an enlarged electrically conductive area for making connection with corresponding clips in a female external socket (not shown). The contact pads terminate near the outer edge of the connector portions 52 and 54. Accordingly, the conductors 50 provide a continuous, interfaceless electrically conductive path between the contact pads 56 on connector portion 52 and the contact pads 56 on the connector portion 54. The contact pads 50 can be plated with gold or other metal to enhance electrical conductivity.

Referring now to FIG. 8, a cover layer 58 is bonded or laminated to the flexible insulating film 42 to cover intermediate portions of conductors 50 which cover the filler block 32. Cover layer 58 may be the same as that disclosed and claimed in U.S. patent application Ser. No. 608,457, entitled "Cover Layer For Flexible Circuits," having the same inventor and assignee as the present invention. Briefly, the cover layer of that application is a tri-layered laminate having a first outer layer of an insulating film, such as Kapton; a second intermediate layer of a modified epoxy adhesive; and a third layer of a phenolic resin adhesive which is bonded contiguous to the conductors. The cover layer 58 is bonded in the same manner as the metallic clad insulating film 38 and 40 is bonded to support member 22 as set out hereinbefore. It should be noted, however, that commercially available cover layers may also be used and bonded in the same manner. One such commercially available cover layer would be an insulating film of Kapton having a single layer of an adhesive coating on one surface thereof.

Referring now to FIG. 9, peripheral portions of the support member 22 are cut away leaving the areas defined by the connector portions 52 and 54 and the filler block 32. This can be accomplished by known stamping techniques. The filler block 32 is then removed between the upper and lower layers of the flexible insulating film as shown in the drawings.

Referring again to FIG. 9, there remains a flexible circuit assembly as embodied in this invention. The flexible circuit assembly includes two rigid connectors 52 and 54 which are connected together by an upper and lower interconnecting cable 60. A plurality of spaced parallel conductors 50 run continuously from the contact pads 56 on connector member 52, through flexible interconnecting cable 60 and terminate at the contact pads 56 on rigid connector member 54. The conductors 50 in the flexible interconnecting 60 are covered by a cover layer 58 which electrically insulates the conductors and protects them from adverse environmental conditions. It is now evident that the flexible circuit assembly of this invention provides at least one rigid connector member and a flexible interconnecting cable which does not require any separate electrical connection therebetween as required in the prior art shown in FIG. 1. Instead, as can be seen most clearly in FIG. 10, the conductors 50 provide an interfaceless electrically conductive path on both the rigid connector 52 and the flexible interconnecting cable 60.

The flexible circuit assembly of this invention can be made using commercially available materials and can be manufacutured using familiar processing steps used in flexible circuit technology. However, the time and expense of making a separate electrical connection between the flexible cable and a rigid connector is eliminated. Furthermore, the reliability of the electrical connection is substantially improved. It should be noted that the length and configurations of the flexible interconnecting cable 60 can be easily modified to accommodate various design criteria. Furthermore, the size and shape of the rigid connectors can be similarly varied. Furthermore, it is not necessary that two rigid connectors be made simultaneously, if, for example, another type of connector is desired to be used at one end. However, if such a connector should be used, a separate electrical connection is required to be made thereto.

Therefore, while this invention has been described in connection with a certain specific example thereof, no limitation is intended thereby except as defined in the appended claims.

I claim:

1. A method of making a flexible circuit connector assembly having rigid connectors and a flexible interconnecting cable in which there are no separate electrical connections therebetween, said method comprising:
    forming an opening in a rigid panel of circuit board material, said opening being in the shape desired for a flexible interconnecting cable;
    filling said opening with an intermediate member;
    placing a metallic clad insulating film on said panel and covering said intermediate member;
    bonding said insulating film only to said panel;
    forming a plurality of conductors on said insulating film, said conductors extending over said intermediate member and terminating at each end in the shape of enlarged contact pads arranged in a row on spaced preselected portions of said panel, said preselected portions to serve as rigid connectors for the flexible circuit connector assembly;
    bonding a cover layer to intermediate portions of the conductors, said cover layer being formed of a tri-layered laminate having a first outer layer of an insulating film, a second intermediate layer of a modified epoxy adhesive and a third layer of a phenolic resin adhesive which become bonded contiguous to said conductors;
    removing peripheral portions of said panel while leaving said preselected connector portions and the intermediate member bridging said connector portions, said peripheral portions being removed so that each connector portion has an edge adapted to receive a female-type socket, with the row of contact pads on each connector being located near the edge; and
    removing said intermediate member to leave a flexible cable interconnecting the connector portions, with said conductors providing an interfaceless electrically conductive path therebetween.

2. The method of claim 1 wherein said insulating film is bonded to the support member by an adhesive.

3. The method of claim 2 wherein the intermediate member is of a material to which the adhesive will not adhere.

4. A method of making a flexible circuit connector assembly having two rigid connectors and a flexible interconnecting cable which does not require a separate electrical connection therebetween, said method comprising:
    forming an opening in a rigid panel of circuit board material having at least one flat major surface, said opening being in the shape of a flexible interconnecting cable desired to be formed;
    filling the opening with an intermediate member having a flat major surface so that said surfaces are mutually coplanar;
    placing a layer of adhesive onto the coplanar surfaces of said panel and intermediate member;
    placing a metallic clad insulating film on said adhesive layer, said insulating film covering the surfaces of said panel and said intermediate member;
    bonding said insulating film only to the panel with said adhesive layer;
    etching a plurality of spaced conductors on said insulating film, said conductors each having at one end an enlarged portion serving as a contact pad which is located on a first preselected portion of said panel, each conductor having an intermediate portion which extends from said contact pad over said intermediate member, each conductor having a second enlarged portion serving as a contact pad on a second preselected portion of said panel which is spaced from said first portion, the contact pads on each preselected portion being arranged in a row, said first and second portions being selected as portions which will serve as rigid connectors;
    bonding a cover layer to intermediate portions of the conductors, said cover layer being formed of a tri-layered laminate having a first outer layer of an insulating film, a second intermediate layer of a modified epoxy adhesive and a third layer of a phenolic resin adhesive which become bonded contiguous to said conductors;

cutting away peripheral portions of said panel to form two connector members defined by said first and second portions, each connector member having an outer edge adapted to engage a female-type socket, with each row of said contact pads being located near said edge; and removing said intermediate member to leave a flexible cable interconnecting said two rigid connector members, said conductors providing a continuous interfaceless electrically conductive path from one contact pad on one rigid connector member extending over said flexible cable and terminating at the contact pad on the other connector member.

5. The method of claim 4 wherein the adhesive layer is a thermosetting epoxy adhesive.

6. The method of claim 5 wherein said intermediate member is of a material to which the epoxy adhesive will not adhere.

* * * * *

UNITED STATES PATENT OFFICE
CERTIFICATE OF CORRECTION

Patent No. 4,026,011          Dated May 31, 1977

Inventor(s) Tommy L. Walton

It is certified that error appears in the above-identified patent and that said Letters Patent are hereby corrected as shown below:

Col. 2, line 58, change "B-10" to read --G-10--.

Signed and Sealed this twenty-third Day of August 1977

[SEAL]

Attest:

RUTH C. MASON
Attesting Officer

C. MARSHALL DANN
Commissioner of Patents and Trademarks